United States Patent

Han

Patent Number: 5,913,429
Date of Patent: Jun. 22, 1999

[54] WAFER SUPPORTING AND/OR CONVEYING APPARATUS

[75] Inventor: Suk-Bin Han, Chungcheongbuk-Do, Rep. of Korea

[73] Assignee: LG Semicon Co., Ltd., Cheongju, Rep. of Korea

[21] Appl. No.: 08/955,466

[22] Filed: Oct. 21, 1997

[30] Foreign Application Priority Data

Dec. 28, 1996 [KR] Rep. of Korea ...................... 96-75706

[51] Int. Cl.⁶ .................................................. A47F 5/00
[52] U.S. Cl. ...................... 211/41.18; 206/454; 118/500
[58] Field of Search ............... 211/41.18, 41.1, 211/41.14; 206/454; 118/500; 134/902

[56] References Cited

U.S. PATENT DOCUMENTS

| | | | |
|---|---|---|---|
| 3,889,815 | 6/1975 | Merle | 211/41.1 |
| 4,191,295 | 3/1980 | Tams | 211/41.1 |
| 4,355,974 | 10/1982 | Lee | 211/41.18 X |
| 4,515,104 | 5/1985 | Lee | 211/41.18 X |
| 4,572,101 | 2/1986 | Lee | 211/41.18 X |
| 4,653,636 | 3/1987 | Armstrong | 211/41.18 X |
| 4,966,549 | 10/1990 | Ohdate | 211/41.18 X |
| 5,011,041 | 4/1991 | Kakizaki . | |
| 5,292,373 | 3/1994 | Arita et al. . | |
| 5,503,173 | 4/1996 | Kudo et al. | 211/41.18 X |
| 5,752,609 | 5/1998 | Kato et al. | 211/41.18 |

*Primary Examiner*—Robert W. Gibson, Jr.
*Attorney, Agent, or Firm*—Fleshner & Kim

[57] ABSTRACT

A wafer supporting and/or conveying apparatus includes at least one supporter having a plurality of recesses into which the edge of a wafer is inserted, for supporting the wafer inserted into the recesses at the lower portion of the wafer; a first connection rod for connecting the supporter to an actuator; at least two holding rods having a plurality of recesses into which the edge of a wafer is inserted, for holding the wafer at the top of its both sides; and a second connection rod for connecting the holding rods to the actuator. A connecting board is set between the first connection rod and supporter, or between the second connection rod and supporter, thereby increasing stability in the apparatus.

19 Claims, 5 Drawing Sheets

WAFER SUPPORTING AND/OR CONVEYING APPARATUS

BACKGROUND OF THE INVENTION

1. Field of the Invention

The present invention relates to a wafer supporting and/or conveying apparatus used in a wet cleaning apparatus for semiconductor devices.

2. Discussion of Related Art

A conventional wafer wet treatment apparatus for cleaning wafers is constructed in such a manner that a wafer is loaded in an inner bath located inside of an external tank, a cleaning solution flows into the bath from the bottom, flows over the bath, and then discharged from the external tank or recirculated in the tanks, to thereby clean the wafer. Here, the wafer is loaded in a wafer supporter carrying a plurality of wafers, and the wafer supporter is conveyed into the bath. A conventional bath used in the wafer cleaning apparatus such as the above-described one is disclosed in U.S. Pat. No.5,071,776, and wafer supporter is described in U.S. Pat. No.5,011,041, which has the U-shape sides.

In the conventional wafer wet cleaning apparatus, the cleaning solution flows into the bath through a flow control board which is the bottom of a cleaning treatment tank, cleans the wafer loaded in the wafer supporter, and then flows over the bath to a discharge recess. The cleaning solution discharged through the discharge recess is discarded or recirculated.

As semiconductor devices are highly integrated, the wafer cleaning technique and apparatus become more important. This is because even a slight amount of contamination due to the wafer cleaning apparatus affects the reliability of the device. This decreases wafer cleaning effect, and produces poor chips. Furthermore, as the diameter of wafer becomes wider, large-size bath is required. Thus, efforts to optimize the bath and other parts of the cleaning apparatus have been made in order to reduce the size of the cleaning apparatus.

For this, the shape of the supporter for supporting and conveying a wafer has been changed from the cassette shape shown as in FIG. 1 into the boat shape 21 shown in FIG. 2. By doing so, the area occupied by the wafer supporter in the bath, and the contact portion of the wafer and supporter are minimized, to thereby remove contamination sources of particles externally introduced from the bath.

The cassette shown in FIG. 1 is constructed in such a manner that sidewalls 11 and 12 are faced to each other in a specific distance, and a wafer 10 is supported by a plurality of protrusions 13, 14, 15 and 16 formed on the sidewalls in a specific interval. With the boat shown in FIG. 2, chucks 24 and 25 hold the side edges of the wafer, and convey it to the bath. Chucks 24 and 25 may also hold boat 21, or wafer only.

In the aforementioned conventional method, the cassette or boat for supporting the wafer, or chuck for holding it in the bath can be the external contamination source. For example, the wafer may be contaminated by coming into contact with the boat. With the bath of the above-described over flowing system, because the contamination source is located under the wafer, contamination materials are moved from the source to the overall surface of the wafer along the flowing line of the cleaning solution when it flows in the bath. These contaminations on the wafer, due to the supporter located under the wafer, or chuck holding the side and bottom of wafer, result in poor semiconductor device.

SUMMARY OF THE INVENTION

Accordingly, the present invention is directed to a wafer supporting and/or conveying apparatus that substantially obviates one or more of the problems due to limitations and disadvantages of the related art.

An object of the present invention is to provide a wafer supporting and/or conveying apparatus, which supports a wafer at the top of its side while minimizingly supports its bottom, to reduce contamination sources and change their locations to the direction to decrease contaminations, thereby protecting the wafer from contaminations.

Unlike the conventional cleaning apparatus in which the area of the wafer bottom supported is wider, and a lot of portions of the wafer bottom are supported, the present invention supports the wafer at the top of its side portions while supporting its bottom at one point, and forms a chuck system at the top of the wafer to tightly hold the wafer.

A wafer supporting and/or conveying apparatus of the present invention includes at least one supporter having a plurality of recesses into which the edge of a wafer is inserted, for supporting the wafer inserted into the recesses at the lower portion of the wafer, a first connection rod for connecting the supporter to an actuator, at least two holding rods having a plurality of recesses into which the edge of a wafer is inserted, for holding the wafer at the top of its both sides; and a second connection rod for connecting the holding rods to the actuator. A connecting board is set between the first connection rod and supporter, or between the second connection rod and supporter, thereby increasing stability in the apparatus. Preferably, a joint is added between the first, second connection rods, and actuator, to bend the connection rods.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
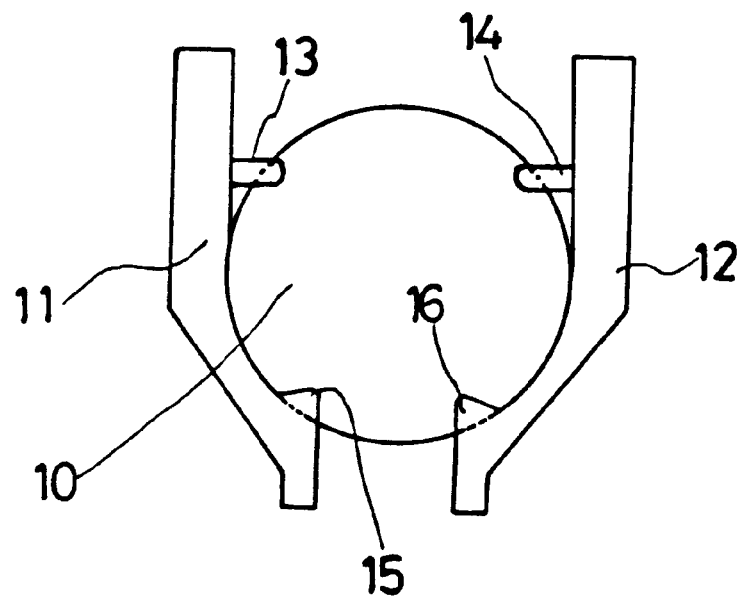
FIG. 1 shows a conventional wafer supporter.
Figure 2:
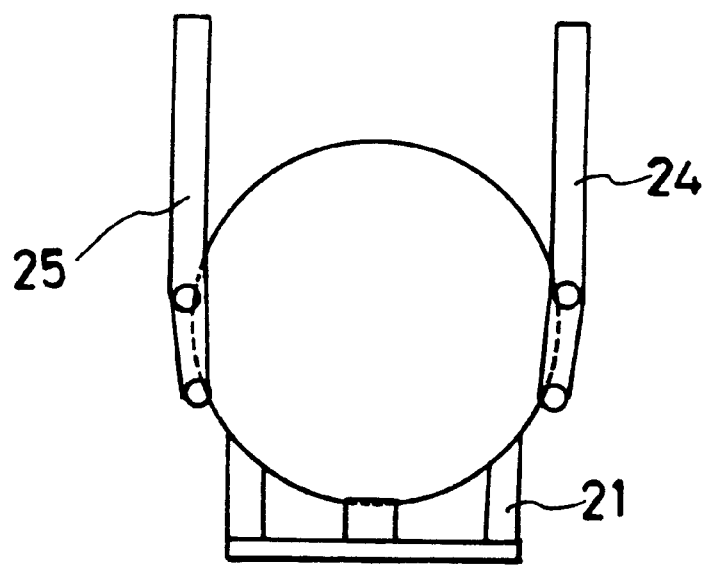
FIG. 2 shows a conventional wafer boat.
Figure 3:
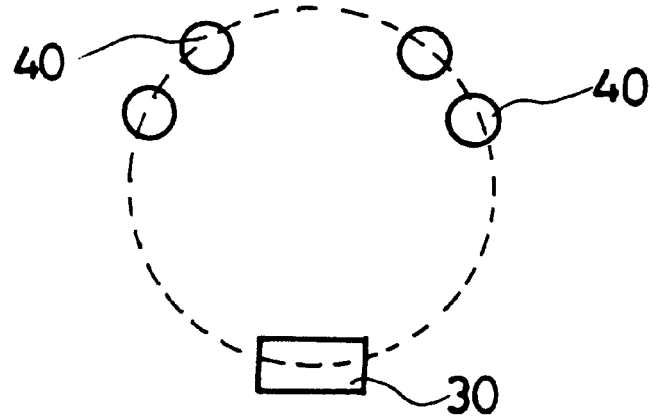
FIG. 3 is a diagram for explaining a wafer supporting and/or conveying apparatus according to the present invention.

FIG. 3 is a diagram for explaining the basic structure of a wafer supporting and/or conveying apparatus according to the present invention. Referring to FIG. 3, the wafer supporting and/or conveying apparatus of the present invention includes a supporter 30 for supporting a wafer to be conveyed at its bottom, and at least two holding rods 40 for supporting and holding the wafer at the top of its side portions. FIG. 3 illustrates an example of four holding rods.

Figure 4:
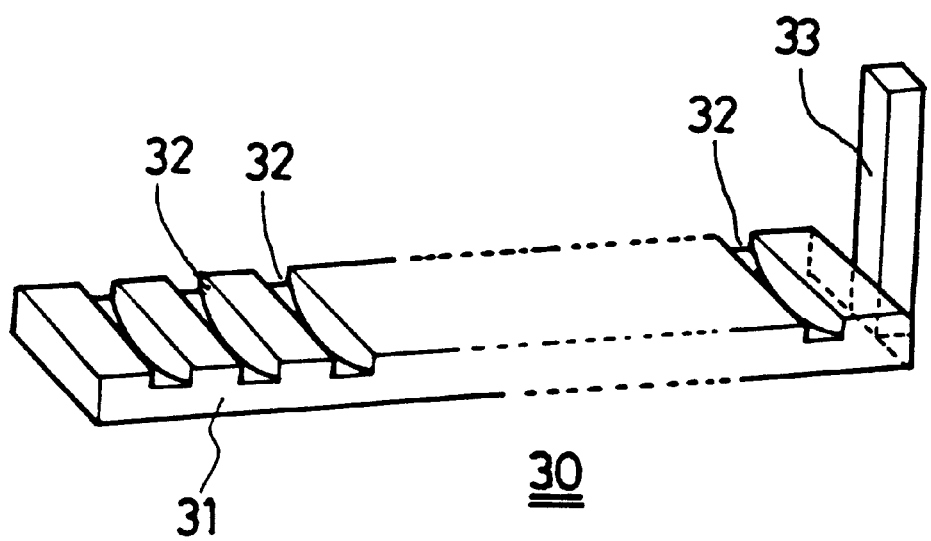
FIG. 4 is a perspective view of a wafer supporter according to the present invention.
Figure 6:
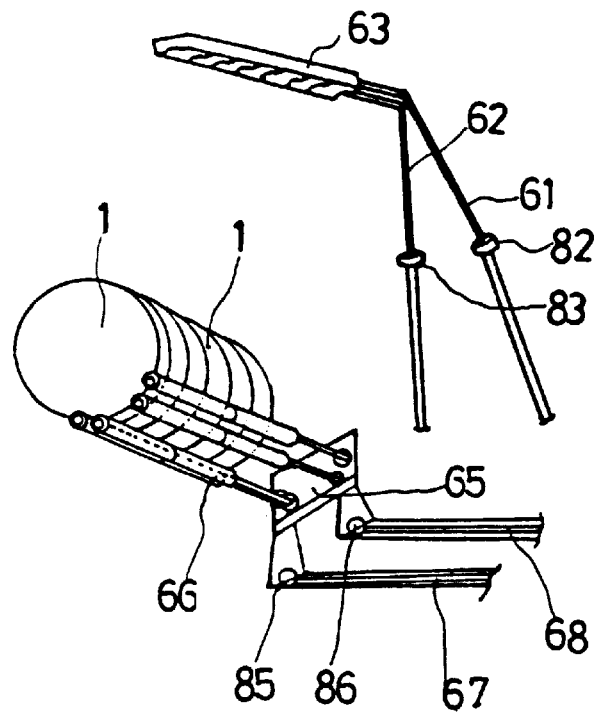
FIG. 6 is a diagram for explaining the operation of holding a wafer using the wafer supporting and/or conveying apparatus according to the present invention.

FIG. 4 is a perspective view of the wafer supporter of the present invention. Referring to FIG. 4, the supporter is constructed in such a manner that a plurality of recesses 32 for holding the wafer are formed on the supporter body 31, and a first connection rod 33 is attached to one side of the body. As shown in FIG. 6, the first connection rod may be formed in a manner that two rods 61 and 62 are attached to one side of the body in the form of two legs of a tripod. Furthermore, it is more preferable that bendable joints 82 and 83 are formed at the middle of connection rods 61 and 62, and thus the connection rods are bent in an appropriate angle. The supporter 30 is moved to a predetermined location by first connection rod 33.

Figure 5A:
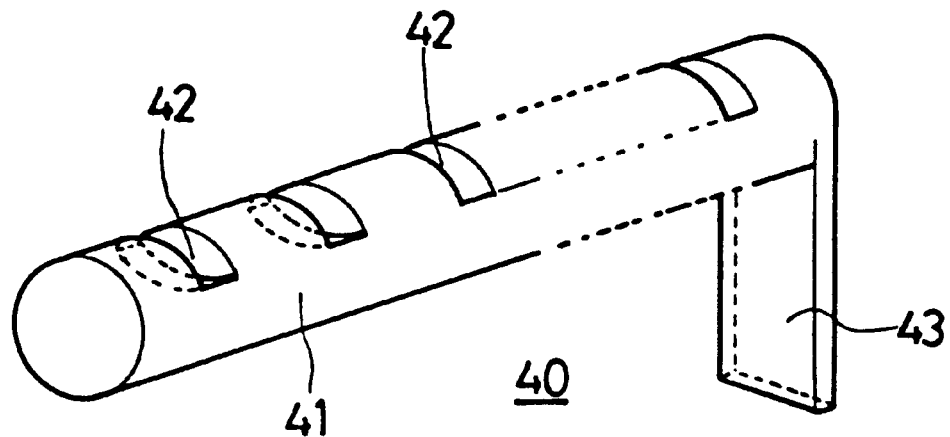
FIG. 5A is a perspective view of a wafer holding rod according to the present invention.
Figure 5B:
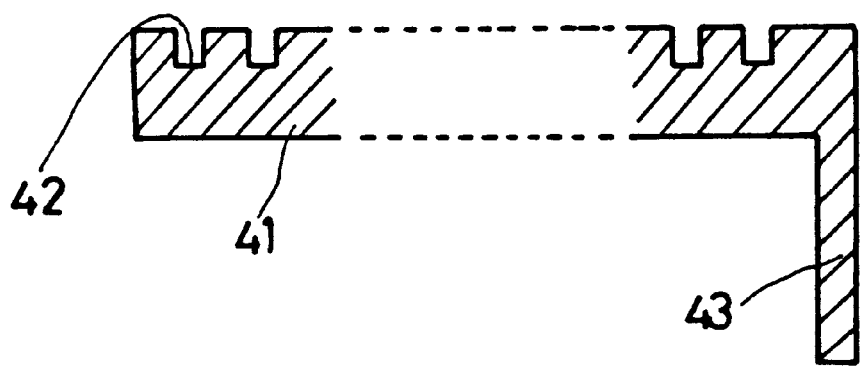
FIG. 5B is a cross-sectional view of a wafer holding rod according to the present invention.

FIGS. 5A and 5B are perspective view and cross-sectional view of wafer holding rod 40 according to the present invention, respectively. Referring to FIGS. 5A and 5B, wafer holding rod 40 is constructed in such a manner that a plurality of recesses 42 for holding the wafer are formed on a body 41 in the same interval as that of recesses 32 of supporter body 31, and a second connection rod 43 is attached to one side of body 41. Holding rod 40 is moved by second connection rod 43. Body 41 of the holding rod may be connected to a connecting board 65 (shown in FIG. 6) first, and then connected to second connection rods 67 and 68. It is preferable that the second connection rods and connecting board 65 are connected using joints 85 and 86, to be bent in a specific angle.

The first and second connection rods are accurately controlled by connecting to a robot arm (not shown) or actuator of an automatic controller (not shown). They can be manually controlled. The above-described component parts of the apparatus are formed of a material, preferably quartz, which has higher strength and does not produce particles. Moreover, a connecting board may be added between the first connection rod and supporter for connecting them to each other. A middle connecting board may be set between the first, second connection rods, and actuator for fixing them.

Figure 7:
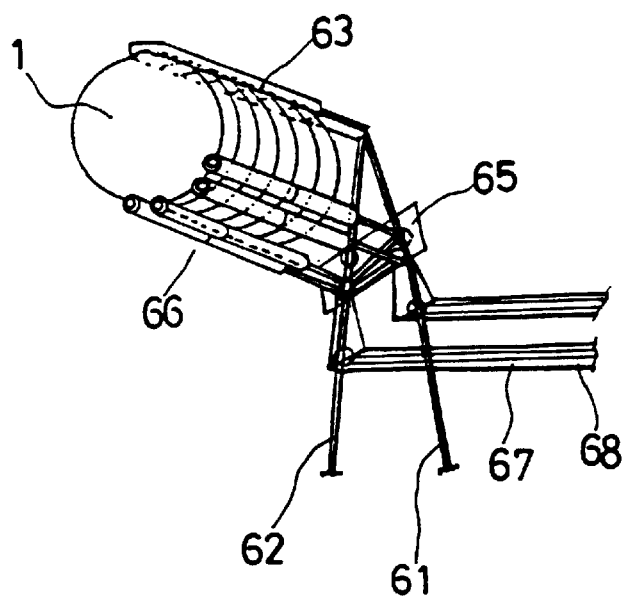
FIGS. 7 and 8 show the state where the wafer is held by the wafer supporting and/or conveying apparatus according to the present invention.
Figure 8:
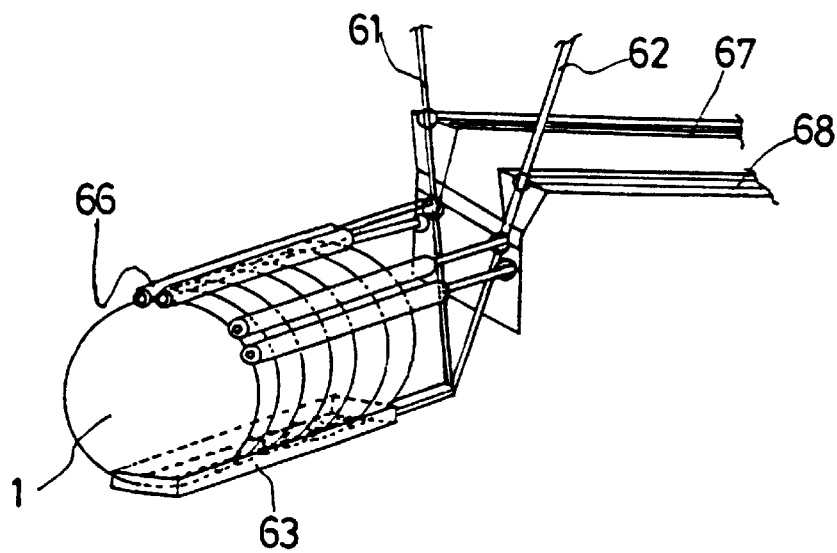

FIG. 6 is a diagram for explaining the operation of holding a wafer using the wafer supporting and conveying apparatus according to the present invention. Referring to FIG. 6, connecting board 65 to which four holding rods 66 are connected is controlled automatically or manually, to rotate the connection rods downward, and wafers 1 are inserted into the recesses formed on four holding rods 66, to be arranged in a row. By moving two connection rods 61 and 62 to which supporter 63 is connected, the recesses formed on the supporter body correspond to each top of wafers 1. Then, the holding rods and supporter hold the wafers as shown in FIG. 7. FIG. 8 shows the state where the wafer supporting and conveying apparatus shown in FIG. 7 is put upside down.

Figure 9:
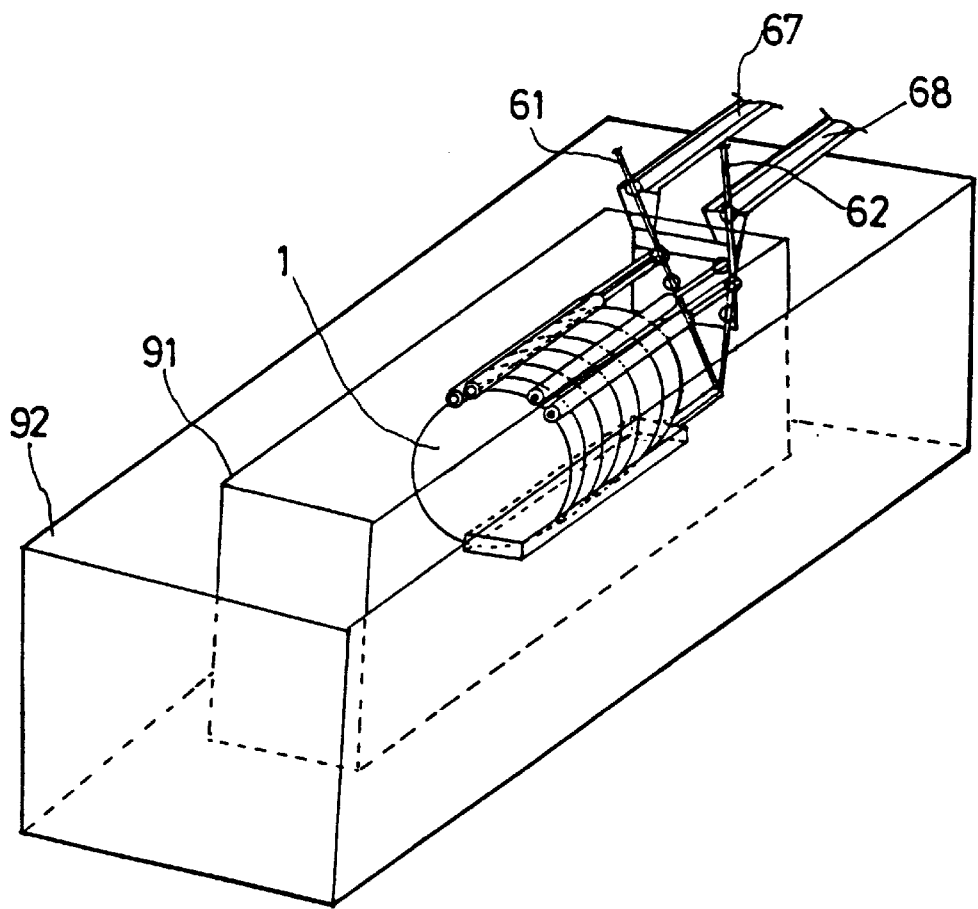
FIG. 9 shows the state where the wafer is fixed in a bath using the wafer supporting and/or conveying apparatus according to the present invention.

FIG. 9 shows the state where the wafer held by the aforementioned wafer supporting and/or conveying apparatus is loaded in an inner tank 91 of an overflow-type bath. With this wafer cleaning apparatus in which the wafers are loaded, a cleaning solution is supplied from the bottom of the inner tank, cleans the wafer, and then flows over the tank. The overflowing cleaning solution is collected in an external tank 92, and then discharged or recirculated.

As described above, if the wafer supporting and/or conveying apparatus of the present invention is used for wafer cleaning process, generation of particles is decreased but the cleaning effect is increased when the wafer is cleaned in the bath because the size of supporter is smaller.

It will be apparent to those skilled in the art that various modifications and variations can be made in the wafer supporting and conveying apparatus of the present invention without departing from the spirit or scope of the invention. Thus, it is intended that the present invention cover the modifications and variations of this invention provided they come within the scope of the appended claims and their equivalents.

What is claimed is:

1. A wafer supporting and/or conveying apparatus comprising:

at least one supporter having a plurality of recesses into which an edge of a wafer is insertable, for supporting a lower portion of a wafer;

a first connection rod, attached to the supporter, for connecting the supporter to an actuator;

at least two holding rods having a plurality of recesses into which an edge of a wafer is insertable, for holding a top side portion of a wafer; and at least one second connection rod, attached to at least one holding rod for connecting the at least one holding rod to the actuator.

2. The apparatus as claimed in claim 1, wherein a connecting board attaches the first connection rod to the at least one supporter.

3. The apparatus as claimed in claim 1, wherein a connecting board attaches the at least one second connection rod to a holding rod.

4. The apparatus as claimed in claim 1, wherein at least one connecting board attaches at least one of the first connection rod and the second connection rod to the actuator.

5. The apparatus as claimed in claim 1, wherein a joint attaches at least one of the first connection rod and the second connection rod to the actuator.

6. The apparatus as claimed in claim 1, wherein ends of the at least two holding rods are attached to a connecting board, and wherein the at least one second connection rod connects the connecting board to the actuator.

7. The apparatus as claimed in claim 6, wherein the first connection rod is slidably attached to the connecting board such that sliding movement of the first connection rod through the connecting board alters a distance between the at least one supporter and the at least two holding rods.

8. The apparatus as claimed in claim 1, further comprising a second first connection rod attached to the supporter.

9. A wafer supporting apparatus, comprising:

a supporter having a plurality of recesses configured to allow edges of wafers to be inserted therein;

a first connecting device, attached to the supporter, and configured to attach the supporter to an actuator;

at least two holding rods, wherein each holding rod has a plurality of recesses configured to allow edges of wafers to be inserted therein; and a second connecting device, attached to the at least two holding rods, and configured to attach the at least two holding rods to the actuator.

10. The apparatus of claim 9, wherein the first connecting device comprises a variable length connecting rod that is attached to the supporter.

11. The apparatus of claim 10, wherein the apparatus is configured such that varying the length of the connecting rod alters a distance between the supporter and the at least two holding rods.

12. The apparatus of claim 10, wherein the variable length connecting rod includes a movable joint.

13. The apparatus of claim 9, wherein the second connecting device comprises a connecting board that is attached to the at least two holding rods.

14. The apparatus of claim 13, wherein the second connecting device further comprises at least one board connecting rod that is attached to the connecting board.

15. The apparatus of claim 13, wherein the first connecting device comprises at least one supporter connecting rod that is attached to the supporter.

16. The apparatus of claim 15, wherein the at least one supporter connecting rod is also attached to the connecting board.

17. The apparatus of claim 16, wherein the at least one supporter connecting rod is slidably attached to the connecting board, and wherein sliding movement of the at least one supporter connecting rod through the connecting board alters a distance between the supporter and the at least two holding rods.

18. The apparatus of claim 9, wherein the second connecting device comprises a connecting board that is attached to the at least two holding rods, and a board supporting rod that attaches the connecting board to the actuator.

19. The apparatus of claim 18, wherein the connecting board is configured to hold the at least two holding rods substantially fixed with respect to one another.

\* \* \* \* \*